United States Patent
Elipe et al.

[11] Patent Number: 6,158,266
[45] Date of Patent: Dec. 12, 2000

[54] PROCESS FOR MANUFACTURING A MOUNTING PLATE

[75] Inventors: Mustafa Elipe, Ansbach; Harald Oed, Nürnberg; Werner Flierl, Sulzbach-Rosenberg, all of Germany

[73] Assignee: Temic Telefunken microelectronic GmbH, Germany

[21] Appl. No.: 09/192,329

[22] Filed: Nov. 16, 1998

[30] Foreign Application Priority Data

Nov. 14, 1997 [DE] Germany ............................ 197 50 433

[51] Int. Cl.[7] .................................................. B21C 37/02
[52] U.S. Cl. .......................................................... 72/379.2
[58] Field of Search .......................... 72/196, 375, 379.2, 72/379.6, 414, 475, 334, 333

[56] References Cited

U.S. PATENT DOCUMENTS

| | | | |
|---|---|---|---|
| 3,611,046 | 10/1971 | Covert . | |
| 4,713,960 | 12/1987 | Gassaway | 72/379.2 |
| 5,581,877 | 12/1996 | Woychik et al. | 29/852 |

FOREIGN PATENT DOCUMENTS

| | | |
|---|---|---|
| 2 718 895 | 10/1995 | France . |
| 2907415 | 9/1980 | Germany . |
| 3642900 | 6/1987 | Germany . |

OTHER PUBLICATIONS

Patents Abstracts of Japan, vol. 14/No. 375 (M–1010) Aug. 14, 1990 JP 02–137620 A.
Patent Abstracts of Japan, vol. 1996/No. 10, Oct. 31, 1996 JP 08 153986 A.
Patent Abstracts of Japan, vol. 017/No. 706 (E–1483) Dec. 22, 1993 JP 05 243756 A.
Patent Abstracts of Japan, vol. 015/No. 419 (E–1126) Oct. 24, 1991 JP 03 175698 A.
Patent Abstracts of Japan, vol. 1996/No. 06 Jun. 28, 1996 JP 08 056086 A.
Patent Abstracts of Japan, vol. 1998/No. 02 Jan. 30, 1998 JP 260871 A.

*Primary Examiner*—Rodney A. Butler
*Attorney, Agent, or Firm*—Venable; George Spencer; Norman N. Kunitz

[57] ABSTRACT

In the case of a mounting plate (1) which features at least one mounting aperture (2) for screwing in a screw (5), the thickness of the mounting plate (1) determines the strength of the connection between the screw (5) screwed into the mounting aperture (2) and the mounting plate (1). To increase the strength of such a screw connection, in the area of at least one mounting aperture (2), the material thickness of the mounting plate (1) is increased by pressing in at least one recess (3) which is placed preferably in a ring-shape around the mounting aperture (2).

9 Claims, 1 Drawing Sheet

PROCESS FOR MANUFACTURING A MOUNTING PLATE

BACKGROUND OF THE INVENTION

In the case of a mounting plate, its thickness determines the strength of a screw connection between the mounting plate and a screw screwed into a mounting aperture of the mounting plate.

SUMMARY OF THE INVENTION

The object of the invention is task to provide a process for manufacturing a mounting plate of the type described above by means of which the strength of the screw connection between one or several screws and the mounting plate is increased.

The above object generally is achieved according to the present invention by a process for manufacturing a mounting plate where the material thickness of the mounting plate is increased in the area of at least one mounting aperture provided for screwing in one screw, by pressing in at least one recess adjacent to this area. Advantageous further developments and embodiments are disclosed and discussed.

Thus, the essence of the invention consists of increasing the material thickness of the mounting plate in the area of a mounting aperture by pressing into the mounting plate at least one recess adjacent to this area, preferably a circular recess surrounding this mounting aperture. To this end, the mounting plate is preferably cold-formed.

The process is excellently suitable for manufacturing mounting plates which act as a heat sink for electronic components or for circuit boards fitted with electronic components.

DESCRIPTION OF THE PREFERRED EMBODIMENTS

In the following the invention will be described in more detail using an embodiment example and making reference to the figures provided.

Figure 1:
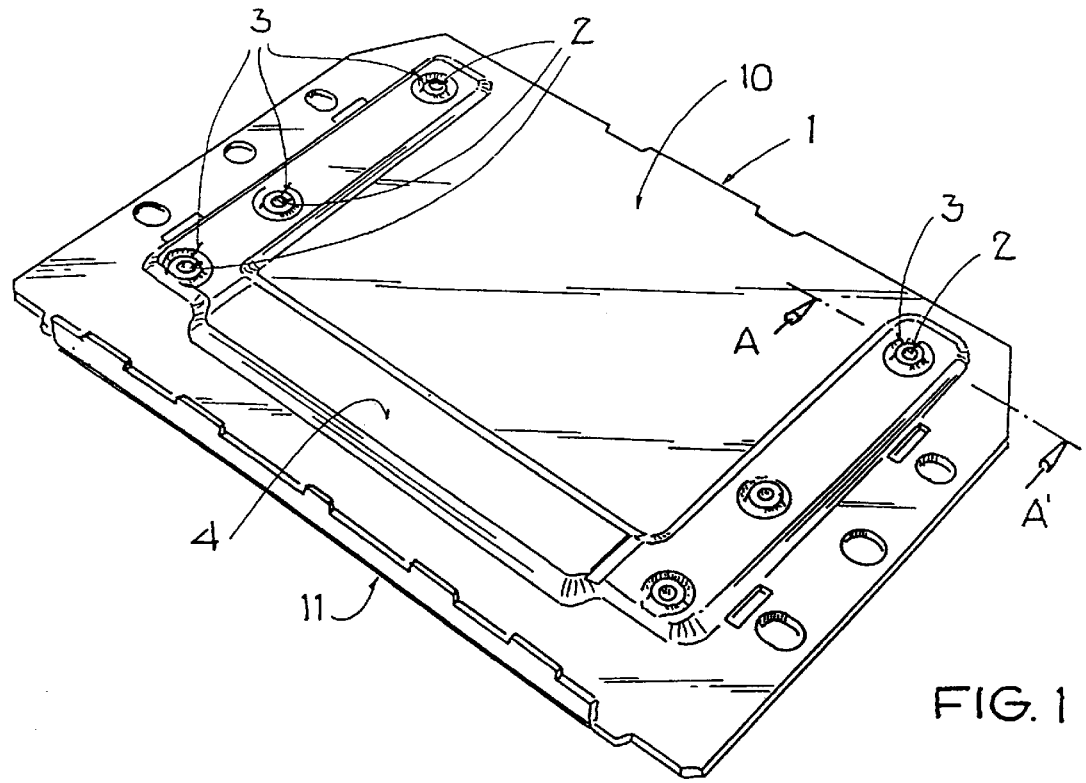
FIG. 1 is a mounting plate according to the invention in a perspective view.

The mounting plate 1 from FIG. 1 is manufactured from a plate of uniform thickness, for example from an aluminum metal sheet having a thickness of 2 mm. During this process, the mounting plate 1 will be initially provided with holes—e.g. by drilling—in order to produce the mounting apertures 2. In a subsequent working step, the surface area 4 and the recesses 3 are formed by cold-forming. Surface area 4 protrudes beyond the top surface side 10, that is, the base area of the mounting plate 1, and is located in a parallel plane to the mounting plate 1. The recesses 3 are placed circularly around the mounting apertures 2.

Figure 2:
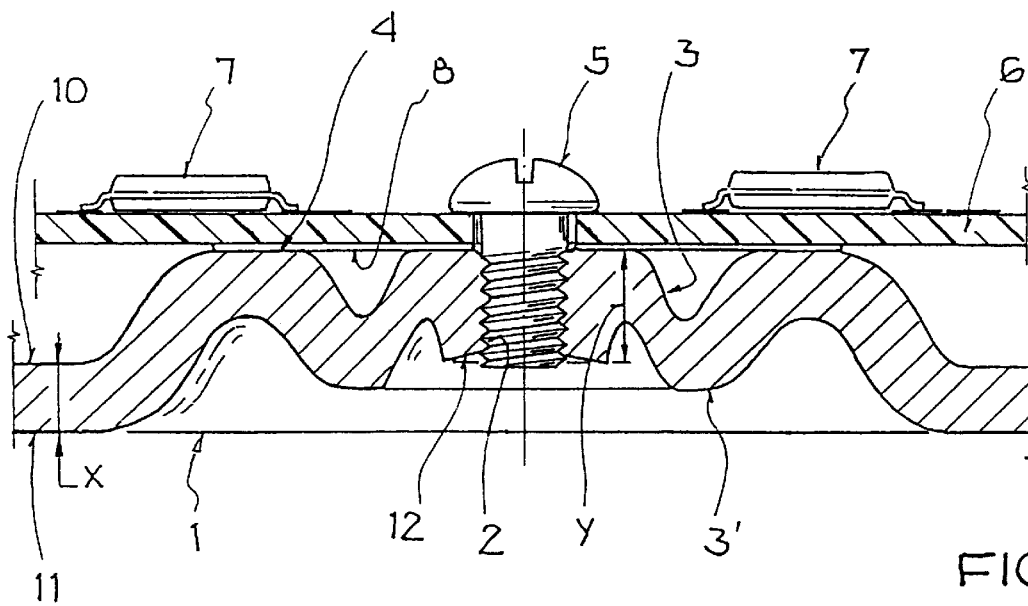
FIG. 2 is a detailed view of the mounting plate from FIG. 1 complete with a circuit board in a cross-sectional view.

The recesses 3 are embossed into the mounting plate 1 by means of a punch. According to FIG. 2, which shows a cross-sectional view of mounting plate 1 along the section A-A' through one of the mounting apertures 2, forming the recesses 3 will displace material in the direction of the respective mounting aperture 2, i.e., radially. This will increase the material thickness y of the mounting plate 1 in the area of mounting apertures 2 by approximately 50%, when compared to the original thickness x of mounting plate 1, and further reduce the material thickness in the areas of the recesses 3. Furthermore, material will also be displaced in the press-in direction of recesses 3, that is, in a vertical direction to the base area of mounting plate 1 such that below the recesses 3 on the lower surface side 11 of the mounting plate 1, ring-shaped material mounds 3' are produced which protrude beyond the lower surface 12 of the thickened areas. When handling the mounting plate 1, these material mounds 3' will reduce the risk of injury with regard to the sharp edges of recesses 2 which occur on the lower surface side 11 of the mounting plate 1, or with regard to the screws 5 screwed into the recesses 2.

In the present embodiment example, the mounting plate 1 provides the cover for a housing into which a circuit board 6 populated with electronic components 7 is fitted. To this end, the circuit board 6 will be connected with mounting plate 1 by means of self-tapping screws 5 which are screwed into the mounting apertures 2. The mounting plate 1 simultaneously acts as a heat sink where the thermal coupling between the circuit board 6 and the mounting plate 1 is improved by the circuit board 6 and the mounting plate 1 being bonded to each other by means of a double-sided adhesive tape 8 which is applied without air bubbles to the degreased surface area 4 of mounting plate 1 before the circuit board 6 is fitted.

What is claimed is:

1. Process for manufacturing a mounting plate (1) comprising: providing a metal mounting plate; forming at least one mounting aperture for screwing in of a screw in the mounting plate; and increasing the material thickness of the mounting plate (1) in the area of the at least one mounting aperture (2) provided for screwing in one screw, by pressing at least one recess (3) adjacent to this area into the surface of the mounting plate.

2. Process according to claim 1 wherein the at least one recess (3) is formed by cold pressing.

3. Process according to claim 1 wherein the at least one recess (3) is disposed in a ring shape around the at least one mounting aperture (2).

4. Process according to claim 1, wherein the mounting plate is cold formed.

5. Process according to claim 1, wherein the provided mounting plate is of a substantially uniform thickness.

6. Process according to claim 3 further comprising pressing at least one surface side of the mounting plate to form, at least in the area of the at least one mounting aperture (2), a circuit board mounting surface area (4) protruding beyond the one surface side (10) of the mounting plate (1), and located in a parallel plane to the one surface side of the mounting plate.

7. A process for manufacturing a mounting plate (1) for use as a heat sink for an electronic component (7) or for a circuit board (6) populated with electronic components comprising: providing a metal mounting plate; forming at least one mounting aperture for screwing in of a screw in the mounting plate; increasing the material thickness of the mounting plate (1) in the area of the at least one mounting aperture (2) provided for screwing in one screw, by pressing at least one recess (3), that is disposed as a ring around the at least one mounting aperture, into the surface of the mounting plate; and, pressing at least one surface side of the mounting plate to form, at least in the area of the at least one mounting aperture (2), a circuit board or electronic component mounting surface area (4) protruding beyond the one surface side (10) of the mounting plate (1), and located in a parallel plane to the one surface side of the mounting plate.

8. Process for manufacturing a mounting plate, comprising the steps of: providing a metal mounting plate of a substantially uniform thickness; forming at least one mounting aperture for the screwing in of a screw in the mounting plate; and cold pressing at least one recess into a surface of the mounting plate adjacent to the area of the at least one mounting aperture to displace material of the mounting plate in a radial direction toward the at least one aperture to increase the thickness of the mounting plate in the area of the at least one aperture.

9. Process according to claim 8, wherein said step of pressing includes forming the at least one recess as a ring surrounding the at least one mounting aperture.

* * * * *